US008253216B2

(12) United States Patent
Zhu

(10) Patent No.: US 8,253,216 B2
(45) Date of Patent: Aug. 28, 2012

(54) GALLIUM NITRIDE SEMICONDUCTOR DEVICE WITH IMPROVED FORWARD CONDUCTION

(75) Inventor: TingGang Zhu, Cupertino, CA (US)

(73) Assignee: Alpha and Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 13/191,325

(22) Filed: Jul. 26, 2011

(65) Prior Publication Data

US 2011/0278589 A1   Nov. 17, 2011

Related U.S. Application Data

(62) Division of application No. 12/388,402, filed on Feb. 18, 2009, now Pat. No. 8,013,414.

(51) Int. Cl.
*H01L 27/095* (2006.01)
*H01L 29/47* (2006.01)
(52) U.S. Cl. ........................ 257/473; 257/476
(58) Field of Classification Search .................. 257/76, 257/472, 473, 476, 479, 621, E29.149, E29.338
See application file for complete search history.

(56) References Cited

U.S. PATENT DOCUMENTS

| | | | |
|---|---|---|---|
| 5,612,547 A * | 3/1997 | Clarke et al. | 257/77 |
| 6,331,450 B1 | 12/2001 | Uemura | |
| 7,084,475 B2 | 8/2006 | Shelton et al. | |
| 7,842,974 B2 * | 11/2010 | Zhu | 257/201 |
| 2005/0029557 A1 | 2/2005 | Hatakeyama et al. | |
| 2008/0135970 A1 * | 6/2008 | Kim et al. | 257/471 |

* cited by examiner

*Primary Examiner* — Hung Vu
(74) *Attorney, Agent, or Firm* — Patent Law Group LLP; Carmen C. Cook

(57) ABSTRACT

A gallium nitride based semiconductor diode includes a substrate, a semiconductor body including a first heavily doped GaN layer and a second lightly doped GaN layer. The semiconductor body includes mesas projecting upwardly from a lower surface where each of the mesas includes the second GaN layer and a portion of the first GaN layer. Schottky contacts are formed on the upper surface of the mesas and ohmic contacts are formed on the lower surface of the semiconductor body. An insulating layer is formed over the Schottky and ohmic contacts. Vias are formed in the insulating layer to the Schottky contacts and vias are formed in the semiconductor body to the Ohmic contacts. An anode electrode is formed in a first metal pad in electrical contact with the Schottky contacts. A cathode electrode is formed in a second metal pad in electrical contact with the ohmic contacts.

8 Claims, 7 Drawing Sheets

GALLIUM NITRIDE SEMICONDUCTOR DEVICE WITH IMPROVED FORWARD CONDUCTION

CROSS-REFERENCE TO RELATED APPLICATION

This application is a divisional of application Ser. No. 12/388,402, filed Feb. 18, 2009, entitled "Gallium Nitride Semiconductor Device With Improved Forward Conduction," by the same inventors hereof, now U.S. Pat. No. 8,013,414, issued Sep. 6, 2011, which application is incorporated herein by reference in its entirety.

FIELD OF THE INVENTION

The invention relates to gallium nitride semiconductor devices and, in particular, to gallium nitride (GaN) Schottky diodes with improved forward conduction.

DESCRIPTION OF THE RELATED ART

A Schottky diode is a semiconductor device formed by a metal contacting a semiconductor layer. The junction between the metal and the semiconductor layer forms a rectifying junction with improved diode switching capability as compared to p-n junction diodes formed entirely in a semiconductor layer. Schottky diodes thus have lower turn-on voltages and faster switching speeds as compared to p-n junction diodes. Schottky diodes are ideal for applications where switching loss is the major source of energy consumption, such as in switch-mode power supplies (SMPS).

Electronic devices made from nitride-based compound semiconductor materials are known. Such electronic devices are also known as III-Nitride semiconductor devices as being formed from Group III nitride based materials. Nitride-based compound semiconductor devices are desirable for their wider band gap and higher breakdown voltage characteristics, rendering them suitable for high voltage and high temperature applications. In particular, III-V gallium nitride (GaN) compound semiconductor Schottky diodes having a high breakdown voltage and a low on-resistance have been described. The efficiency of switch-mode power supplies can be improved through the use of III-Nitride semiconductor Schottky barrier diodes.

However, nitride-based semiconductor Schottky diodes have certain shortcomings as compared to silicon-based Schottky diodes. Silicon-based Schottky diodes employ a vertical conduction path while nitride based Schottky diodes often rely on a lateral conduction path. This is because nitride-based semiconductor are formed on top of insulating substrate and/or insulating buffer layer expitaxially grown on conducting or non-conducting substrate. Schottky diodes having a lateral conduction path tend to have a higher turn-on resistance when the device is forward biased because the forward current must travel over a relatively long conduction path and non-uniform current distribution results.

FIG. 1 duplicates FIG. 3A and FIG. 2 duplicates FIG. 6A of U.S. Pat. No. 7,084,475 B1 and illustrates a GaN semiconductor device. The '475 patent describes forming finger-shaped mesas upon which Schottky contacts are formed. The ohmic contacts of the cathode are interdigitated with the finger-shaped mesas to reduce the current path length and thereby reduce forward resistance. The cathode electrode is made through solder bumps formed on the ohmic contacts and a central mesa area (area 626 in FIG. 2) serves as a bonding pad of the anode electrode.

SUMMARY OF THE INVENTION

According to one embodiment of the present invention, a gallium nitride based semiconductor diode includes a substrate, a semiconductor body including a first GaN layer of a first conductivity type formed on the substrate and a second GaN layer of the first conductivity type formed on the first GaN layer where the second GaN layer is more lightly doped than the first GaN layer, the semiconductor body further including a pattern of mesas projecting upwardly from a lower surface where the lower surface extends partially into the first GaN layer and each of the mesas includes the second GaN layer and a portion of the first GaN layer, a first metal layer formed on an upper surface of the mesas for forming a Schottky junction with the second GaN layer, a second metal layer formed on the lower surface between the mesas for forming ohmic contacts to the first GaN layer, an insulating layer formed over the first and second metal layers, a first set of vias formed in the insulating layer to form openings to the first metal layer where the first set of vias is filled with a via metal, a second set of vias formed in the insulating layer between the mesas to form openings to the second metal layer where the second set of vias is filled with the via metal, a first metal pad formed overlying the insulating layer and in electrical contact with the first set of vias where the first metal pad forms an anode electrode, and a second metal pad formed overlying the insulating layer and in electrical contact with the second set of vias where the second metal pad forms a cathode electrode.

According to another aspect of the present invention, a gallium nitride based semiconductor diode includes a conducting substrate, an insulating buffer layer formed on a first surface of the conducting substrate, a semiconductor body including a first GaN layer of a first conductivity type formed on the insulating buffer layer and a second GaN layer of the first conductivity type formed on the first GaN layer where the second GaN layer is more lightly doped than the first GaN layer, the semiconductor body further including mesas projecting upwardly from a lower surface where the lower surface extends partially into the first GaN layer and each of the mesas includes the second GaN layer and a portion of the first GaN layer, a first metal layer formed on an upper surface of the mesas for forming a Schottky junction with the second GaN layer, a second metal layer formed on the lower surface of the semiconductor body between the mesas for forming ohmic contacts to the first GaN layer, an insulating layer formed over the first and second metal layers, a first set of vias formed in the insulating layer to form openings to the first metal layer where the first set of vias is filled with a first via metal, a second set of vias formed in the semiconductor body and the insulating buffer layer to electrically connect the second metal layer formed on the lower surface of the semiconductor body to the conducting substrate where the second set of vias is filled with a second via metal, a first metal pad formed overlying the insulating layer and in electrical contact with the first set of vias where the first metal pad forming an anode electrode, and a second metal pad formed on a second surface of the conducting substrate, where the second surface is opposite the first surface and the second metal pad forms a cathode electrode.

The present invention is better understood upon consideration of the detailed description below and the accompanying drawings.

DETAILED DESCRIPTION OF THE PREFERRED EMBODIMENTS

In accordance with the principles of the present invention, a nitride-based compound semiconductor Schottky diode ("nitride-based Schottky diode") uses via interconnects to provide electrical connections from the Schottky contacts and the ohmic contacts, formed in underlying metal layers, to an overlying metal layer. The anode electrode and the cathode electrode are then formed in the overlying metal layers to allow the entire area under the electrodes to be used as active diode regions. In particular, the nitride-based Schottky diode includes mesa structures formed in the semiconductor body where Schottky contacts are formed on the top of the mesa structures and ohmic contacts are formed on a lower surface of the semiconductor body between the mesas. Via interconnects are formed in an insulating layer to provide electrical connection to the Schottky contacts on top of the mesas and to provide electrical connection to the ohmic contacts on lower surface between the mesas. The mesa structures maximize the forward current conduction of the Schottky diode without wasting useful semiconductor real estate.

In the following description, the term "nitride-based compound semiconductor" or "III-nitride compound semiconductor" refers to those III-V compound semiconductor materials formed between nitrogen and the elements in Group III of the periodic table, usually aluminum (Al), gallium (Ga), and indium (In). The term also refers to ternary and tertiary compounds such as AlGaN and AlInGaN. The preferred materials for the nitride-based compound semiconductor Schottky diode includes GaN and AlGaN. In the present description, Schottky diodes formed using gallium-nitride (GaN) compound semiconductor are sometimes referred to as "GaN Schottky diodes". However, the use of GaN as the nitride-based semiconductor material is illustrative only and the nitride-based compound semiconductor Schottky diodes of the present invention can be formed using other III-V compound semiconductor materials, presently known or to be developed.

Figure 3:
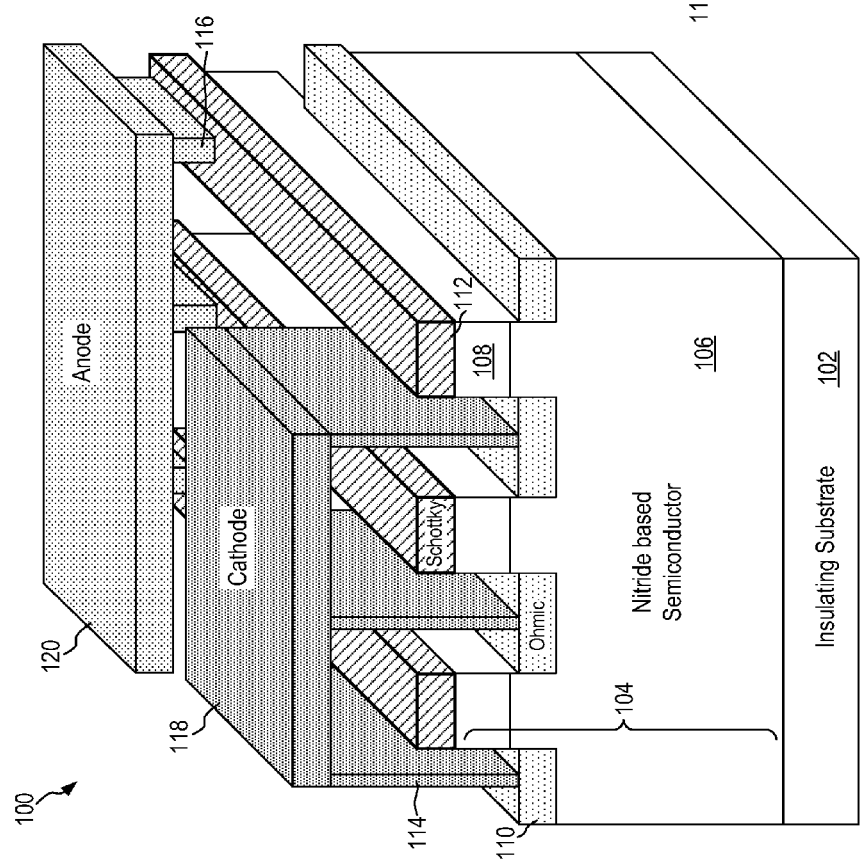
FIG. 3 is a perspective view of a GaN Schottky diode according to a first embodiment of the present invention.

FIG. 3 is a perspective view of a GaN Schottky diode according to a first embodiment of the present invention. Referring to FIG. 3, a GaN Schottky diode 100 is formed on an insulating substrate 102. The insulating substrate 102 can be formed from a material selected from sapphire, ZnO, AlN, GaN, semi-insulating SiC or glass. GaN Schottky diode 100 includes a nitride-based compound semiconductor body 104 (nitride semiconductor body 104) formed on the substrate. In the present embodiment, semiconductor body 104 includes a heavily doped GaN layer 106 formed on the substrate 102 and a lightly doped GaN layer 108 formed on the heavily doped GaN layer 106. Semiconductor body 104 includes multiple mesas projecting upwardly from a lower surface. The lower surface extends partially into the heavily doped GaN layer 106. Thus, each mesa is formed by the lightly doped GaN layer 108 and a portion of the heavily doped GaN layer 106.

A metal layer is formed in the lower surface to make contact with the heavily doped GaN layer 106 to form ohmic contacts 110 to the cathode of the Schottky diode 100. The metal layer for forming ohmic contacts may be a metal selected from the group of Al, AlSi, Ti, TiSi, Mo, and MoSi. Another metal layer is formed on the upper surface of the mesas to form a Schottky junction with the lightly doped GaN layer 108. The metal layer for forming a Schottky junction may be a metal selected from the group of Ni, Pt, Au, Co, Pd, Cr, Rh, Re, PtSi, V, W, WSi and NiSi. Schottky contacts 112 are thus formed on the upper surface of the mesas. An insulating layer (not shown) is formed over the Schottky contacts 112 and the ohmic contacts 110 to insulate the Schottky diode structure thus formed. The insulating layer can be formed from materials including SiOx, SiNx, Al2O3, AlN, polymer, spin on glass and other dielectric or electrically insulating materials.

Electrical connections to the Schottky contacts 112 and the ohmic contacts 110 are made through vias in the insulating layer. A first set of vias 116 are formed in the insulating layer with openings onto the Schottky contacts 112. A second set of vias 114 are formed in the insulating layer with openings onto the ohmic contacts 110. The via openings are filled with a via metal such as tungsten (W). The via metal can also be a metal selected from the group of TiW, Al, Au, Cu, Ti, Ag and AlCuSi. An overlying metal layer on the insulating layer is used to connect the vias to form respective anode electrode and cathode electrode. More specifically, a first metal pad 120 in the overlying metal layer is formed connecting to the first set of vias 116. Metal pad 120 forms the anode electrode. A second metal pad 118 in the overlying metal layer is formed connecting to the second set of vias 114. Metal pad 118 forms the cathode electrode. External connections to the anode electrode and the cathode electrode can then be made through respective metal pads 120 and 118.

Figure 1:
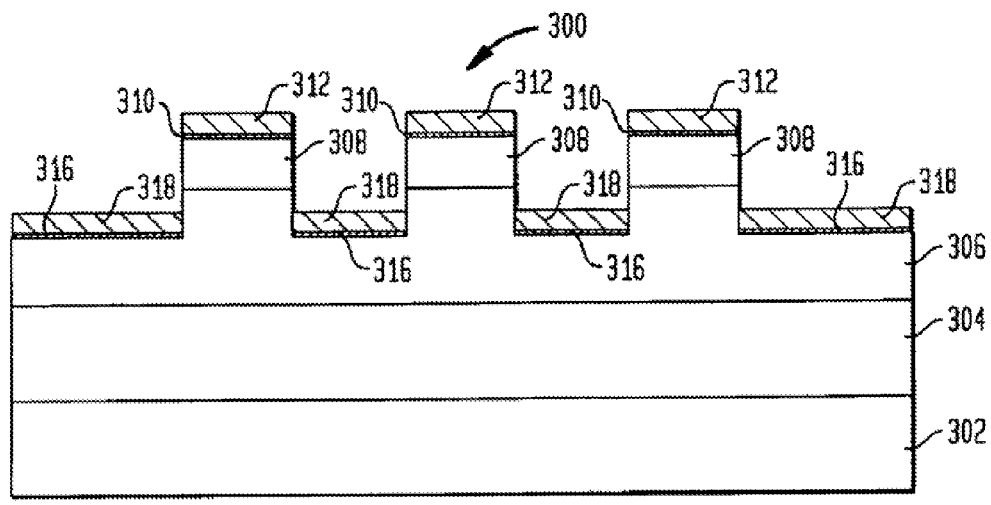
FIG. 1 duplicates FIG. 3A of U.S. Pat. No. 7,084,475 B1 and illustrates a GaN semiconductor device.
Figure 2:
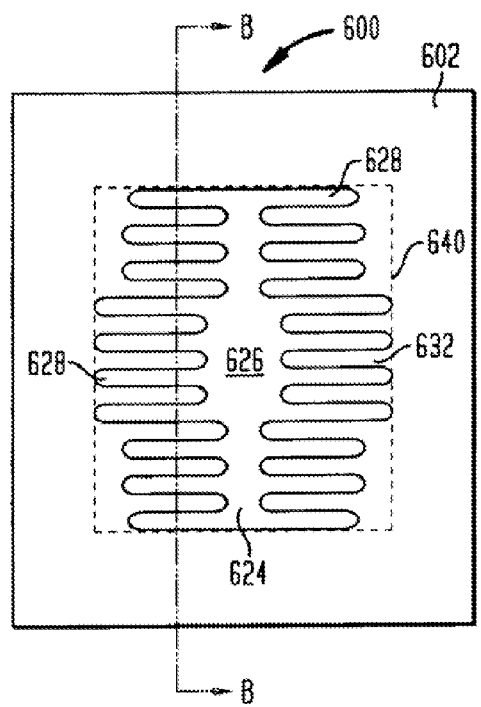
FIG. 2 duplicates FIG. 6A of U.S. Pat. No. 7,084,475 B1 and illustrates a GaN semiconductor device.
Figure 4:
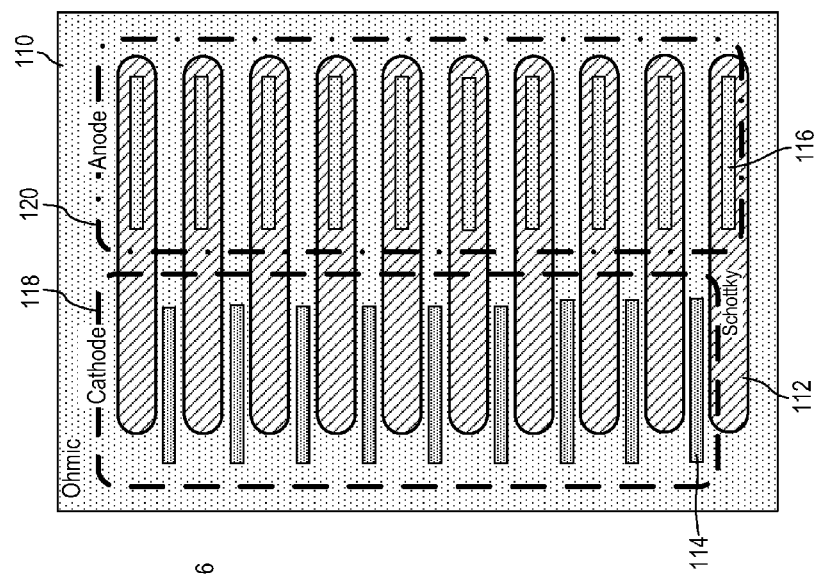
FIG. 4 is a top view of the GaN Schottky diode of FIG. 3 according to one embodiment of the present invention.

FIG. 4 is a top view of the GaN Schottky diode of FIG. 3 according to one embodiment of the present invention. As shown in FIGS. 3 and 4, in GaN Schottky diode 100, the anode electrode 120 and the cathode electrode 118 are formed in a metal layer overlying the Schottky contacts and the ohmic contacts. Thus, the entire area under the anode and cathode electrodes can be used as active diode regions. That is, the ohmic contacts 110 interdigitate the mesas on which Schottky contacts 112 are formed. By increasing the perimeter between the Schottky contact and the Ohmic contacts, the forward conduction of GaN Schottky diode 100 is thereby enhanced.

Figure 6:
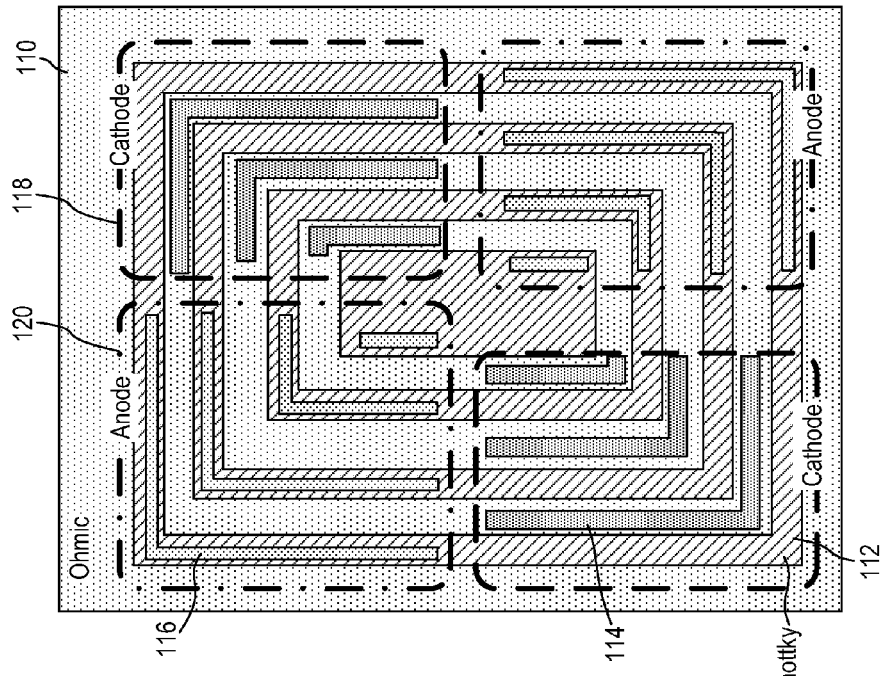
FIG. 6 is a top view of the GaN Schottky diode according to a third embodiment of the present invention.
Figure 5:
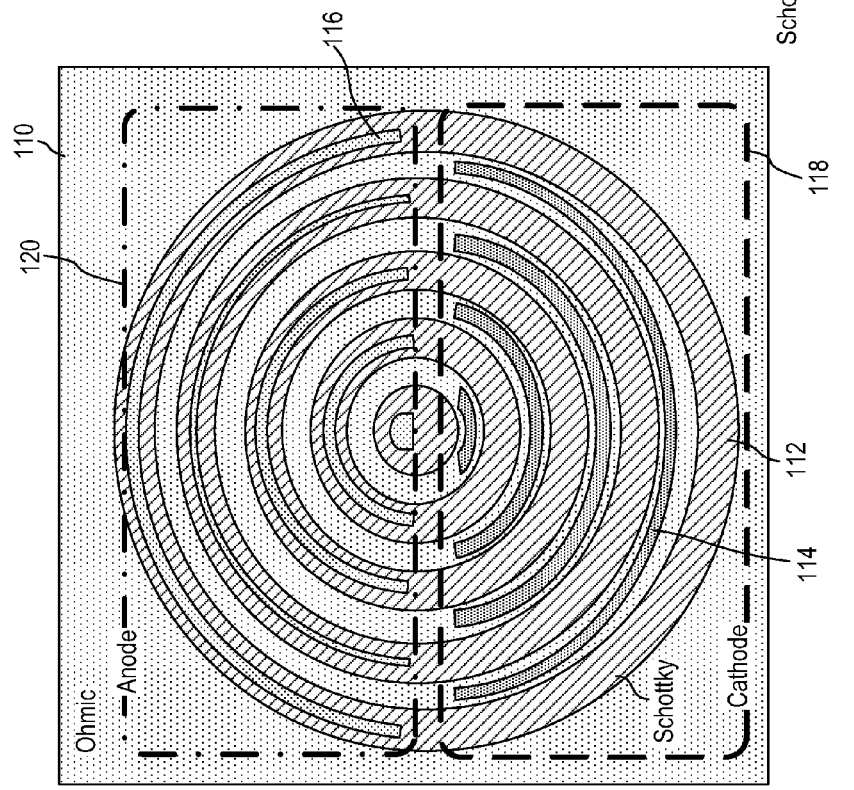
FIG. 5 is a top view of the GaN Schottky diode according to a second embodiment of the present invention.

In the GaN Schottky diode embodiment shown in FIGS. 3 and 4, the Schottky contacts 112 are formed as separated islands of rectangular-shaped regions. In other embodiments, the GaN Schottky diode of the present invention can assume different shapes and geometries. For example, the rectangular-shaped regions in GaN Schottky diode 100 can be interconnected in one embodiment. Furthermore, geometries that reduces electric field crowding are useful for further enhancing the breakdown voltage of the GaN diode. FIG. 5 is a top view of the GaN Schottky diode according to a second embodiment of the present invention. FIG. 6 is a top view of the GaN Schottky diode according to a third embodiment of the present invention. Like elements in FIGS. 3-6 are given like reference numerals to simplify the discussion.

Referring first to FIG. 5, the mesas on which the Schottky contacts 112 are formed are patterned as concentric circular regions interdigitated with ohmic contact regions 110. By forming the mesas as circular regions, electric field crowding that typically occurs at corners of the geometries are eliminated. A first metal pad 120 in the overlying metal layer is formed connecting to the first set of vias 116. Metal pad 120 forms the anode electrode. A second metal pad 118 in the overlying metal layer is formed connecting to the second set of vias 114. Metal pad 118 forms the cathode electrode.

Referring next to FIG. 6, the mesas on which the Schottky contacts 112 are formed are patterned as concentric rectangular regions. In the present embodiment, the concentric rectangular regions are divided into quadrants and the vias for connecting to the Schottky contacts 112 and the ohmic contacts 110 are formed in alternate quadrants. Accordingly, metal pads 120 for forming the anode electrode are disposed over the Schottky contact vias 116 and thus metal pads 120 are also formed in alternate quadrants. Similarly, metal pads 118 are formed over the ohmic contact vias 114 and metal pads 118 are formed in alternate quadrants. Distributing the anode and cathode electrodes in quadrants has the benefits of spreading out the electric field.

Figure 7:
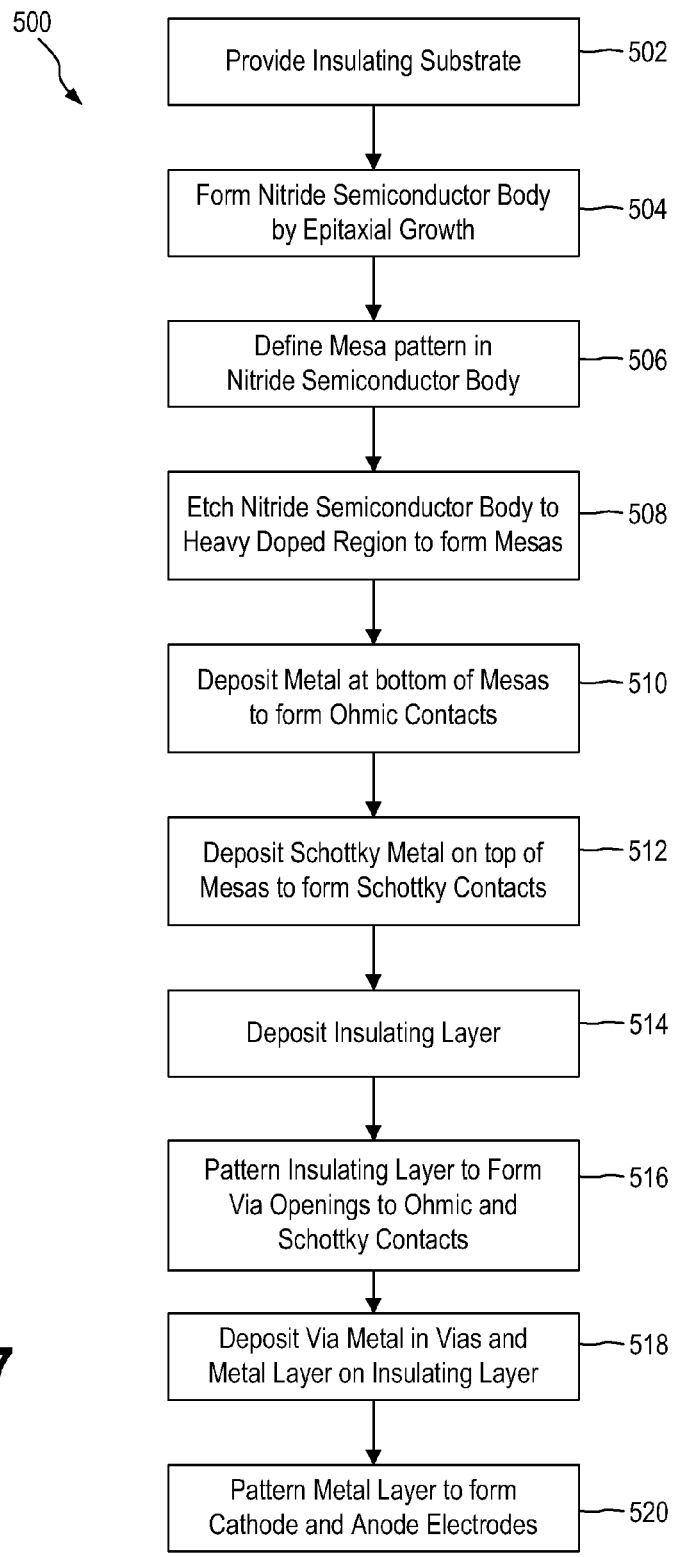
FIG. 7 is a flow chart illustrating the fabrication process for fabricating the GaN Schottky diode of FIG. 3 according to one embodiment of the present invention.

FIG. 7 is a flow chart illustrating the fabrication process for fabricating the GaN Schottky diode of FIG. 3 according to one embodiment of the present invention. Referring to FIG. 7, method 500 starts with providing an insulating substrate (step 502). Then, the nitride semiconductor body is formed by epitaxial growth (step 504). As shown in FIG. 3, the nitride semiconductor body 104 includes a lower layer of heavily doped GaN semiconductor layer 106 and an upper layer of lightly doped GaN semiconductor layer 108. Then, a mesa pattern is defined in the nitride semiconductor body 104 (step 506). The mesa pattern can be defined using a photoresist layer and a photolithography process. Once the mesa pattern is defined, the nitride semiconductor body 104 is etched down to the heavily doped region to form the upwardly projecting mesas (step 508).

Then, a metal layer is deposited on the lower surface of the nitride semiconductor body 104 to form ohmic contacts 110 (step 510). Another metal layer is deposited on the upper surface of the mesas to form Schottky contacts 112 (step 512). An insulating layer is then deposited over the entire surface of the semiconductor body and the metal layers (step 514). The insulating layer is patterned to define via openings to the ohmic contacts 110 and the Schottky contacts 112 (step 516). The insulating layer is etched to form the via openings. Then via metal is deposited to fill the vias and an overlying metal layer is deposited on top of the insulating layer electrically connected to all the vias (step 518). Finally, the overlying metal layer is patterned to form metal pads as the anode electrode 120 and the cathode electrode 118 (step 520).

Alternate Embodiment

In the above-described embodiments, the GaN Schottky diodes are described as being formed on an insulating substrate. In other embodiments, the GaN Schottky diodes are formed on conducting substrates, such as silicon. An insulating buffer layer is typically used between the conducting substrate and the GaN semiconductor layer.

Figure 8:
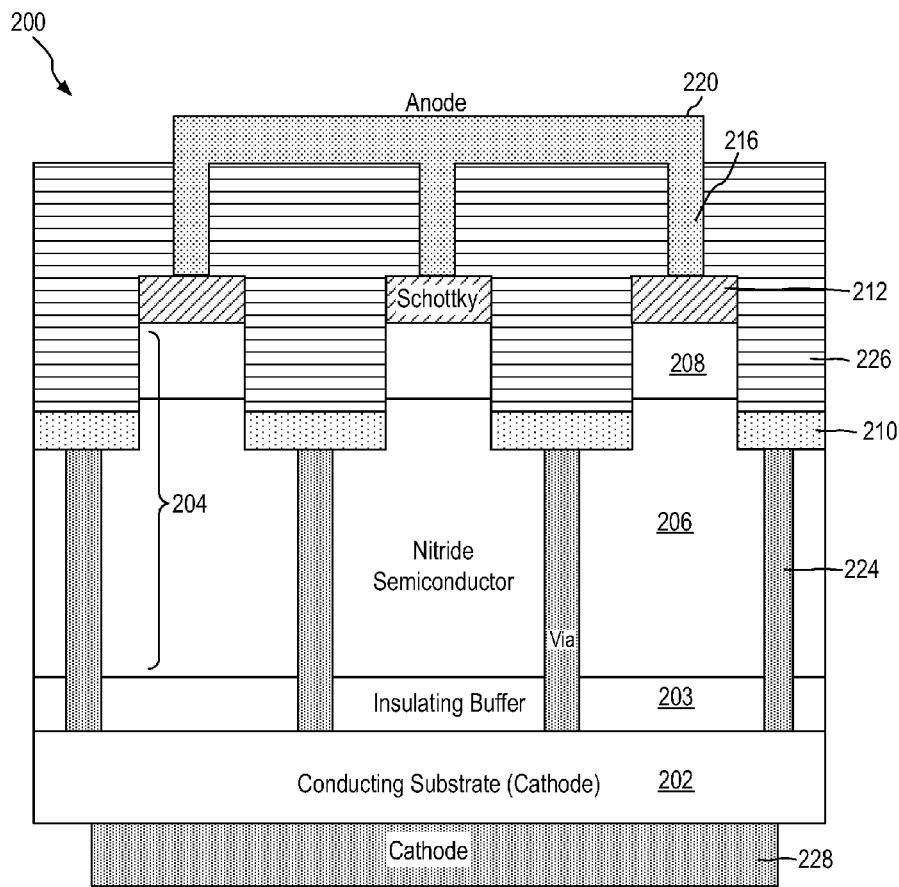
FIG. 8 is a cross-sectional view of a GaN Schottky diode according to an alternate embodiment of the present invention.

According to another aspect of the present invention, a GaN Schottky diode is formed on a conducting substrate with an insulating buffer layer. The conducting substrate enables vertical conduction and the GaN Schottky diode utilizes the conducting substrate to form a backside cathode electrode. FIG. 8 is a cross-sectional view of a GaN Schottky diode according to an alternate embodiment of the present invention. Referring to FIG. 8, a GaN Schottky diode 200 is formed on a conducting substrate 202, such as silicon. An insulating buffer layer 203 is formed on the conducting substrate. Then, a nitride-based compound semiconductor body 204 (nitride semiconductor body 204) is formed on the insulating buffer layer 203. In the present embodiment, semiconductor body 204 includes a heavily doped GaN layer 206 formed on the insulating buffer 203 and a lightly doped GaN layer 208 formed on the heavily doped GaN layer 206. Semiconductor body 204 includes multiple mesas projecting upwardly from a lower surface. The lower surface extends partially into the heavily doped GaN layer 206. Thus, each mesa is formed by the lightly doped GaN layer 208 and a portion of the heavily doped GaN layer 206.

A metal layer is formed in the lower surface to make contact with the heavily doped GaN layer 206 to form ohmic contacts 210 to the cathode of the Schottky diode 200. Another metal layer is formed on the upper surface of the mesas to form a Schottky junction with the lightly doped GaN layer 208. Schottky contacts 212 are thus formed on the upper surface of the mesas. An insulating layer 226 is formed over the Schottky contacts 212 and the ohmic contacts 210 to insulate the Schottky diode structure thus formed. The insulating layer 226 can be formed from materials including SiOx, SiNx, Al2O3, AlN, polymer, spin on glass and other dielectric or electrically insulating materials.

Electrical connections to the Schottky contacts 112 are made through vias in the insulating layer. A first set of vias 216 are formed in the insulating layer with openings onto the Schottky contacts 112. The via openings are filled with a via metal such as tungsten. An overlying metal layer on the insulating layer 226 is used to connect the vias to form the anode electrode 220. More specifically, a first metal pad in the overlying metal layer is formed connecting to the first set of vias 116 where the first metal pad 220 forms the anode electrode.

In GaN Schottky diode 200, electrical connection to the cathode is provided through a backside cathode electrode formed on the backside of conducting substrate 202. More specifically, a second set of vias 224 are formed in the heavily doped GaN layer 206 beneath the ohmic contacts 210. Vias 224 extends through the insulating buffer 203 to the conducting substrate 202. Vias 224 are filled with a via metal, such as tungsten. The via metal for vias 224 can be the same or can be different form the via metal being used for vias 216. A backside electrode 228 is formed on the backside of conducting substrate 202 to form the cathode electrode. In this manner, the cathode connection is made from ohmic contacts 210, through vias 224 to conducting substrate 202 and finally at backside cathode electrode 228.

In GaN Schottky diode 200, only the Schottky contacts are brought out through an insulating layer. The mesa structure forming the Schottky contacts can assume different geometries as described above with reference to FIGS. 4-6. In another embodiment, GaN Schottky diode 200 is formed using a cathode electrode that is brought out on the same side as the anode electrode and using metal pads on the overlying metal layer to form the separate cathode and anode connections, as shown in FIGS. 3-6. However, the use of a backside cathode electrode has the added advantage of a more compact device and smaller device size.

Figure 9:
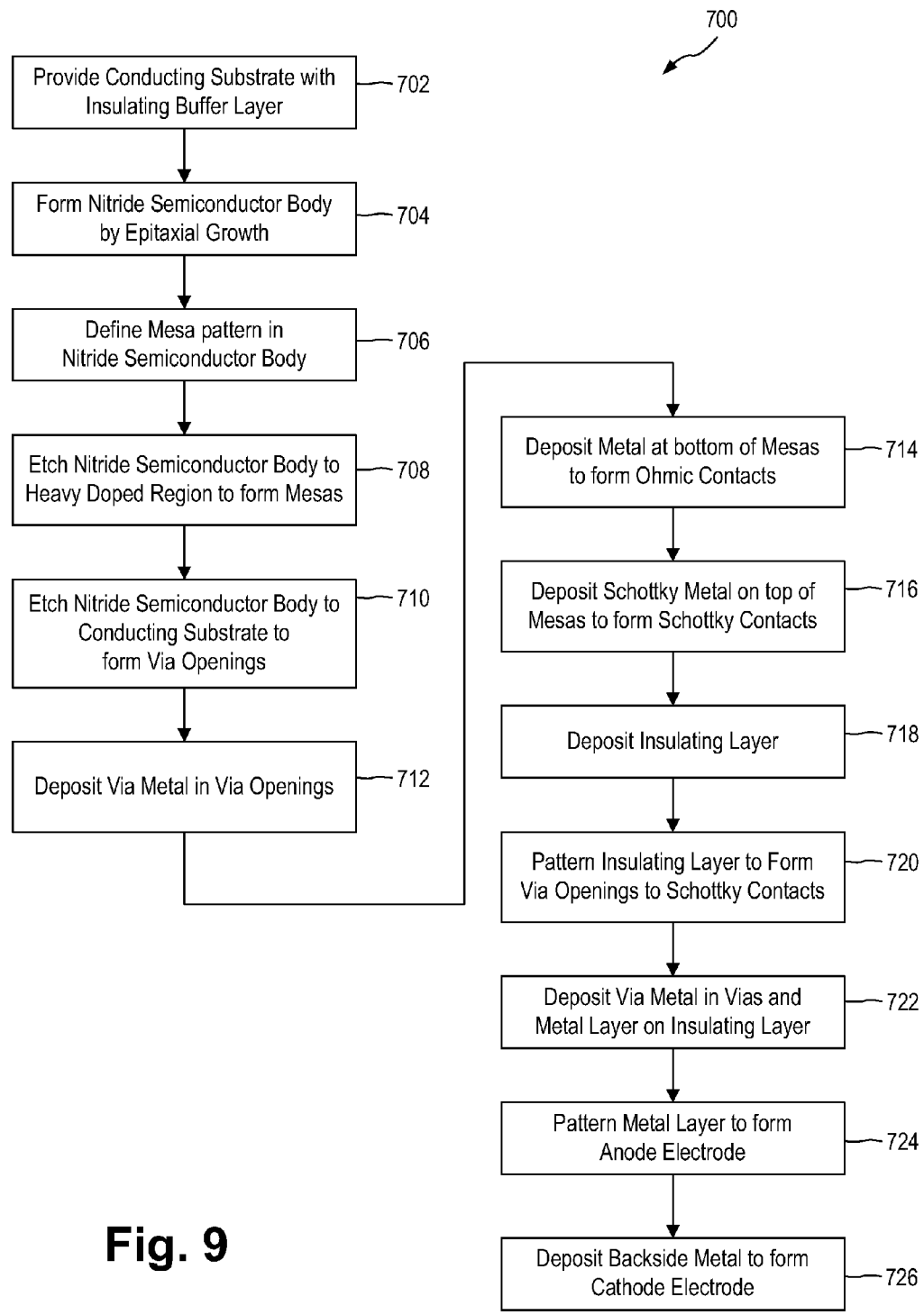
FIG. 9 is a flow chart illustrating the fabrication process for fabricating the GaN Schottky diode of FIG. 8 according to one embodiment of the present invention.

FIG. 9 is a flow chart illustrating the fabrication process for fabricating the GaN Schottky diode of FIG. 8 according to one embodiment of the present invention. Referring to FIG. 9, method 700 starts by providing a conducting substrate 202 with an insulting buffer layer 203 formed thereon (step 702). Then, the nitride semiconductor body is formed by epitaxial growth (step 704). As shown in FIG. 8, the nitride semiconductor body 204 includes a lower layer of heavily doped GaN semiconductor layer 206 and an upper layer of lightly doped GaN semiconductor layer 208. Then, a mesa pattern is defined in the nitride semiconductor body 204 (step 706). The mesa pattern can be defined using a photoresist layer and a photolithography process. Once the mesa pattern is defined, the nitride semiconductor body 204 is etched down to the heavily doped region to form the upwardly projecting mesas (step 708).

Then, via openings in the nitride semiconductor body are formed to form electrical connection to the conducting substrate (step 710). That is, the nitride semiconductor body 204 is patterned and etched all the way to the conducting substrate 202. Via metal is deposited into the via openings to form vias 224 (step 712).

Then, a metal layer is deposited on the lower surface of the nitride semiconductor body 204 to form ohmic contacts 210 (step 714). Another metal layer is deposited on the upper surface of the mesas to form Schottky contacts 212 (step 716). An insulating layer 226 is then deposited over the entire surface of the semiconductor body and the metal layers (step 718). The insulating layer is patterned to define via openings to the Schottky contacts 112 (step 720). The insulating layer is etched to form the via openings. Then via metal is deposited to fill the vias and an overlying metal layer is deposited on top of the insulating layer electrically connected to all the vias (step 722). The overlying metal layer is patterned to form one or more metal pads as the anode electrode 220 (step 724). Finally, a backside metal layer is deposited on the backside of the conducting substrate to form the cathode electrode 228. (step 726).

Figure 10:
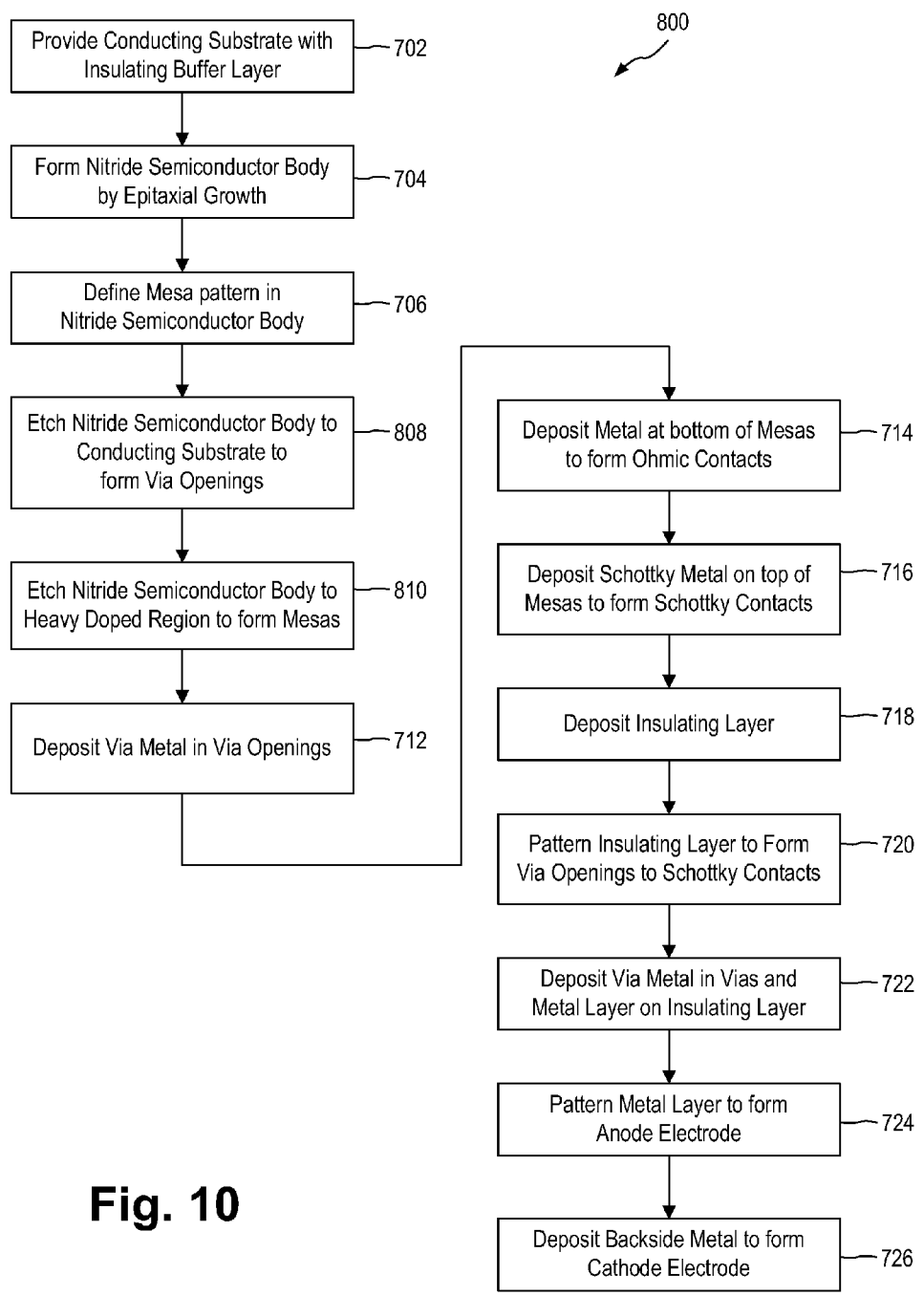
FIG. 10 is a flow chart illustrating the fabrication process for fabricating the GaN Schottky diode of FIG. 8 according to an alternate embodiment of the present invention.

FIG. 10 is a flow chart illustrating the fabrication process for fabricating the GaN Schottky diode of FIG. 8 according to an alternate embodiment of the present invention. Method 800 in FIG. 10 is the same as method 700 but uses a different method for forming the vias 224 to the conducting substrate. Like steps in FIGS. 9 and 10 are given like reference numerals to simplify the discussion. Referring to FIG. 10, after the nitride-based semiconductor body is formed and the mesa pattern is defined (step 706), the semiconductor body is further processed by defining the via openings for vias 224 (step 808). The nitride semiconductor body is etched all the way down to the conducting substrate. Then the nitride semiconductor body is etched to the heavily doped GaN layer 206 to form the mesas (step 810). Then, method 800 continues with filling the via openings with a via metal to form vias 224 (step 712. The subsequent processing steps in method 800 are the same as in method 700 and will not be further described.

The above detailed descriptions are provided to illustrate specific embodiments of the present invention and are not intended to be limiting. Numerous modifications and variations within the scope of the present invention are possible. The present invention is defined by the appended claims.

I claim:

1. A gallium nitride based semiconductor diode, comprising:
   a conducting substrate;
   an insulating buffer layer formed on a first surface of the conducting substrate;
   a semiconductor body comprising a first GaN layer of a first conductivity type formed on the insulating buffer layer and a second GaN layer of the first conductivity type formed on the first GaN layer, the second GaN layer being more lightly doped than the first GaN layer, the semiconductor body including a plurality of mesas projecting upwardly from a lower surface, the lower surface extending partially into the first GaN layer, each of the plurality of mesas including the second GaN layer and a portion of the first GaN layer;
   a first metal layer formed on an upper surface of the plurality of mesas for forming a Schottky junction with the second GaN layer;
   a second metal layer formed on the lower surface of the semiconductor body between the plurality of mesas for forming ohmic contacts to the first GaN layer;
   an insulating layer formed over the first and second metal layers;
   a first plurality of vias formed in the insulating layer to form openings to the first metal layer, the first plurality of vias being filled with a first via metal;
   a second plurality of vias formed in the semiconductor body and the insulating buffer layer to electrically connect the second metal layer formed on the lower surface of the semiconductor body to the conducting substrate, the second plurality of vias being filled with a second via metal;
   a first metal pad formed overlying the insulating layer and in electrical contact with the first plurality of vias, the first metal pad forming an anode electrode; and
   a second metal pad formed on a second surface of the conducting substrate, the second surface being opposite the first surface, the second metal pad forming a cathode electrode.

2. The diode of claim 1, wherein the first conductivity type comprises N-type conductivity.

3. The diode of claim 1, wherein the plurality of mesas are formed as separated parallel elongated linear regions of the second GaN layer and the portion of the first GaN layer, the linear regions being interdigitated with the ohmic contacts formed on the lower surface of the semiconductor body.

4. The diode of claim 3, wherein the plurality of mesas are formed as separated parallel rectangular-shaped regions.

5. The diode of claim 1, wherein the plurality of mesas are formed as separated concentric ring-shaped regions of the second GaN layer and the portion of the first GaN layer, the concentric regions being interdigitated with the ohmic contacts formed on the lower surface of the semiconductor body.

6. The diode of claim 5, wherein the separated concentric ring-shaped regions comprises concentric circular regions.

7. The diode of claim 5, wherein the separated concentric ring-shaped regions comprises concentric rectangular regions.

8. The diode of claim 1, wherein the first metal layer comprises a metal selected from the group of Ni, Pt, Au, Co, Pd, Cr, Rh, Re, PtSi, V, W, WSi and NiSi.

* * * * *